United States Patent
Khayat et al.

(10) Patent No.: US 10,439,648 B1
(45) Date of Patent: Oct. 8, 2019

(54) AREA EFFICIENT IMPLEMENTATION OF A PRODUCT CODE ERROR CORRECTING CODE DECODER

(71) Applicant: Micron Technology, Inc., Boise, ID (US)

(72) Inventors: Patrick R. Khayat, San Diego, CA (US); Sivagnanam Parthasarathy, Carlsbad, CA (US); Shantilal Doru, San Diego, CA (US); Nicholas J. Richardson, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/950,131

(22) Filed: Apr. 10, 2018

(51) Int. Cl.
*H03M 13/00* (2006.01)
*H03M 13/29* (2006.01)
*H03M 13/15* (2006.01)
*G06F 11/10* (2006.01)

(52) U.S. Cl.
CPC ..... *H03M 13/2909* (2013.01); *G06F 11/1076* (2013.01); *H03M 13/1575* (2013.01)

(58) Field of Classification Search
CPC .......... H03M 13/2909; H03M 13/1575; G06F 11/1076
See application file for complete search history.

(56) References Cited

U.S. PATENT DOCUMENTS

| 6,279,135 B1 * | 8/2001 | Nguyen | G11B 20/1833 714/756 |
| 6,363,511 B1 * | 3/2002 | Massoudi | G11B 20/1833 714/755 |
| 6,978,343 B1 * | 12/2005 | Ichiriu | G11C 15/00 365/49.1 |

(Continued)

OTHER PUBLICATIONS

Chien, et al., "Hybrid methods for finding roots of a polynomial—With application to BCH decoding (Corresp.)," IEEE Transactions on Information Theory, Mar. 1969, vol. 15 (2), pp. 325-339.

(Continued)

*Primary Examiner* — Esaw T Abraham
(74) *Attorney, Agent, or Firm* — Nicholson De Vos Webster & Elliott LLP

(57) ABSTRACT

A method and system for implementing error correcting code using a product code decoder. The method and system receive a product code, wherein the product code is a matrix of row and column component codes, generate a plurality of row syndromes column syndromes from the received product code, store the plurality of row syndromes in a row syndrome queue, store the plurality of column syndromes in a column syndrome queue, the column and row syndrome queue to support the plurality of modes of operation corresponding to the plurality of phases of decoding the product code, correct the plurality of row syndromes and columns syndromes in the row and column syndrome queues based on errors detected in respective row and column syndromes and errors detecting in overlapping syndromes, and correct (Continued)

the product code in a codeword buffer at locations corresponding to corrections in the plurality of row syndromes and the plurality of column syndromes.

20 Claims, 9 Drawing Sheets

(56) References Cited

U.S. PATENT DOCUMENTS

| | | | | |
|---|---|---|---|---|
| 7,380,200 B2* | 5/2008 | Dent | ................... | G06F 11/1048 714/805 |
| 7,395,488 B2* | 7/2008 | Finkelstein | ....... | H03M 13/2909 714/763 |
| 7,600,177 B2* | 10/2009 | Qian | .................. | G11B 20/1833 714/755 |
| 7,624,330 B2* | 11/2009 | Juluri | ................ | G11B 20/1833 714/755 |
| 7,702,100 B2* | 4/2010 | Han | ..................... | H04L 9/0631 380/28 |
| 8,051,300 B2* | 11/2011 | Cherian | ................ | G06F 3/0605 380/277 |
| 9,391,641 B2* | 7/2016 | Subramanian | ...... | H03M 13/159 |
| 9,998,148 B2* | 6/2018 | Lin | ..................... | H03M 13/152 |

OTHER PUBLICATIONS

Cho, et al., "Block-Wise Concatenated BCH Codes for NAND Flash Memories," IEEE Transactions on Communications, Apr. 2014, vol. 62 (4), pp. 1164-1177.

Kim, et al., "Quasi-Primitive Block-Wise Concatenated BCH Codes With Collaborative Decoding for NAND Flash Memories," IEEE Transactions on Communications, Oct. 2015, vol. 63 (10), pp. 3482-3496.

U.S. Appl. No. 15/461,623, titled "Error Correction Code (ECC) Operations in Memory for Providing Redundant Error Correction," filed Mar. 17, 2017, 23 pages.

U.S. Appl. No. 15/461,672, titled, "Tiered Error Correction Code (ECC) Operations in Memory," filed Mar. 17, 2017, 26 pages.

* cited by examiner

AREA EFFICIENT IMPLEMENTATION OF A PRODUCT CODE ERROR CORRECTING CODE DECODER

FIELD OF THE INVENTION

The various embodiments described in this document relate to error correction in memory devices. In particular, embodiments include systems and methods for performing error correction in memory devices using a product code decoder in particular with the use of a row and column syndrome queue to support iterative decoding.

BACKGROUND OF THE INVENTION

Memory devices (e.g., non-volatile memory) can suffer from errors in the writing or retention of bits that are stored within the memory devices. An error correcting code (ECC) is a mechanism to correct these errors in the memory. ECC uses redundant data, referred to as parity data, to enable the ECC process to recover and correct errors in the normal data. Parity bits are utilized in conjunction with normal data bits, which are both stored in the memory device, and are utilized by the ECC process to detect and correct any bit errors in the stored data when the parity bits are not consistent with their associated data. Highly effective ECC processes can utilize low-density parity codes (LDPC), Bose, Chaudhri, and Hocquenghem (BCH) codes, Reed-Solomon code and similar code systems as part of the ECC process. These codes are derived from the data stored data in the memory devices and can be used to correct the memory data where errors occur. These code systems provide good error correction capability, but come at the penalty of either higher complexity (e.g., increased gate-counts) and power consumption, or restricted bandwidth and latency within a given area and power budget for the decoding hardware utilized to process such code.

The high complexity and power consumption requisite for these code systems require significant space and cost in ECC design for memory devices. Controllers that incorporate or support these ECC mechanisms must thus have a significant footprint and design cost. In some cases, however, controller devices may not have extensive space available for such ECC designs and in all cases reduced cost and complexity can be useful features of an ECC design. Removing, ECC from memory devices can reduce cost but increases the probability of failure and a lack of data recovery capability for high value computing operations can make a non-ECC implementation of memory an unsatisfactory option.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Systems, methods, and devices are described herein for providing error correcting code (ECC) capabilities in a memory device with reduced complexity, space, and cost requirements. Categories of ECC processes such as turbo product codes that have both powerful correction capabilities and relatively light area footprints can mitigate the problem of cost and complexity, but require carefully optimized design of their hardware implementation substructures in order to realize their technical advantages. The embodiments utilize a product code and a product code decoder (PCD) to perform the ECC process. The use of a PCD is area efficient and energy efficient. The PCD improves hardware efficiency for ECC at a given level of error correction and throughput capability in terms of both gate-count and power consumption. The embodiments provide microarchitecture and hardware design details of a PCD as well as variations on the PCD design and operation as part of an ECC memory device. In particular, the embodiments provide a method and apparatus for efficiently correcting bits inside a codeword buffer as part of a product code decoder.

Memory devices are implemented as internal, semiconductor, integrated circuits in computers or other electronic devices. There are different types of memory devices including volatile and non-volatile memory devices. Volatile memory can require power to maintain its stored data and includes random-access memory (RAM), dynamic random-access memory (DRAM), synchronous DRAM (SDRAM) and similar devices. Non-volatile memory devices can persist data by retaining stored data without power such as flash memory devices as well as read only memories (ROMS) including erasable programmable ROMS (EPROMS). Other types of non-volatile memory devices can include phase change RAM (PCRAM), resistive RAM (RRAM), magnetoresistive RAM (MRAM), and similar technologies.

Memory devices can be combined to form a storage volume of a memory system such as a solid-state drive (SSD) or similar device. A SSD can include volatile and non-volatile memory components. SSDs are used in place of hard disk drives as main storage devices for computer systems. SSDs provide better performance, size, weight, durability, and power consumption than hard disk drives.

Memory devices can be utilized in a wide range of electronic devices. Both volatile and non-volatile memory devices can be used in computing and consumer devices including personal computers, memory sticks, digital cameras, handheld devices (e.g., smart phones and tablets), console devices, toys, and similar devices. Memory devices in any of these contexts can implement ECC to ensure the integrity of the data stored in these devices.

Figure 1:
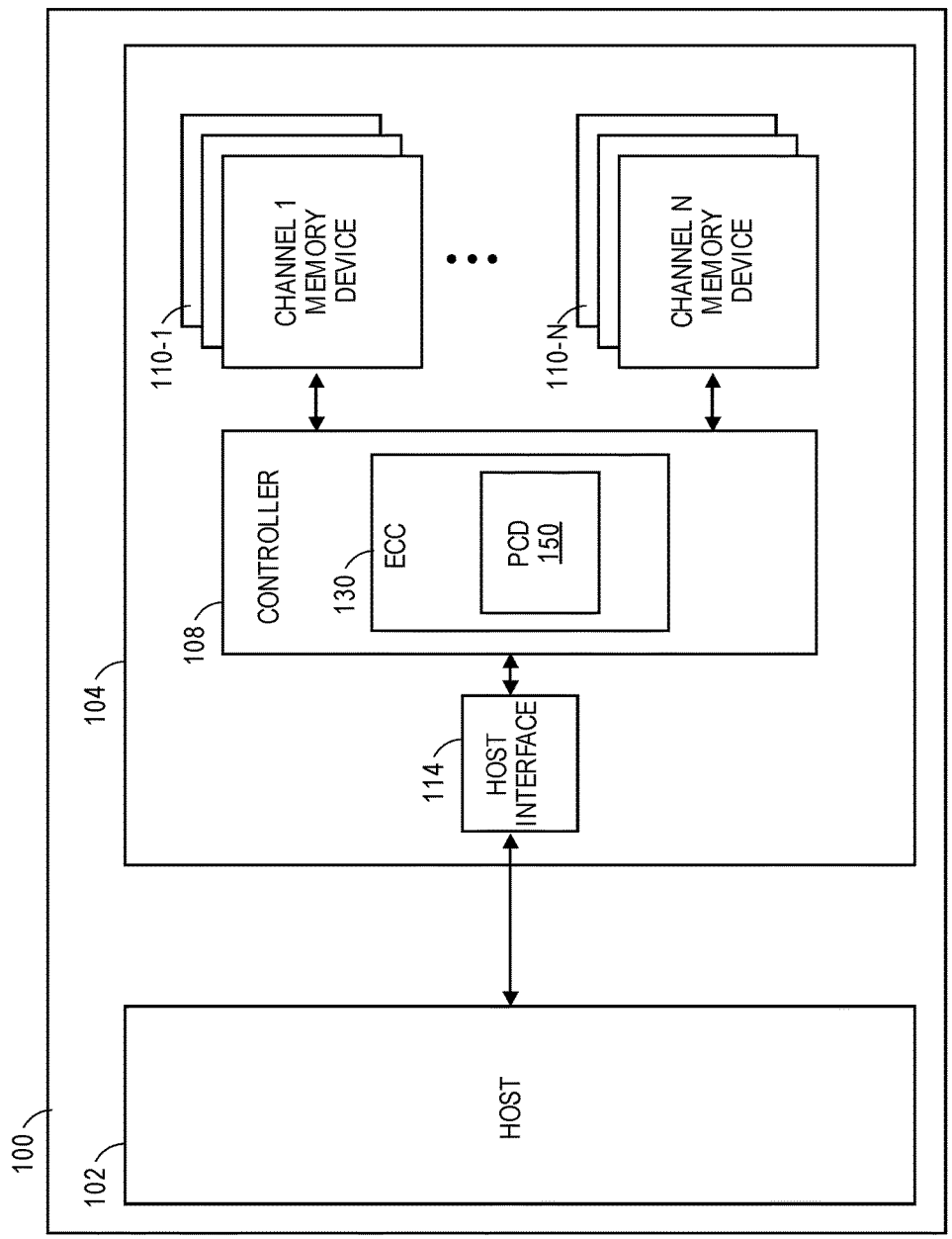
FIG. 1 is a functional block diagram of a device including at least one memory system.

FIG. 1 is a functional block diagram of a device 100, including at least one memory system 104, in accordance with one or more embodiments. The device 100 can be any type of device that can incorporate a memory device and memory system 104. The device 100 can include a host 102 and the memory system 104. The host 102 can be any type of subsystem that can utilize a memory system 104. For example, the host 102 can write data to the memory system 104 and read data from the memory system 104. The host 102 is integrated with the memory system 104 in a small or compact device 100 or is a separate distinct component in other types of devices 100.

In the embodiment illustrated in FIG. 1, the memory system 104 includes a controller 108 and one or more memory devices $110_1$-$110_N$, which correspond to separate memory channels. In this example, the controller 108 is external to the one or more memory devices $110_1$-$110_N$. The memory devices $110_1$-$110_N$ can provide storage for the memory system 104 and/or the device 100 (e.g., the memory devices $110_1$-$110_N$ can be formatted with a particular file system for use by the computing system 100). The controller 108 includes control circuitry (e.g., hardware, firmware, and/or software) for controlling/managing the memory devices $110_1$-$110_N$. In one or more embodiments, the controller 108 is an application specific integrated circuit (ASIC) coupled to a printed circuit board, including a physical interface to the memory devices $110_1$-$110_N$. The controller 108 includes or otherwise utilizes one or more processors and/or local memory/storage (not illustrated) for use in controlling/managing the memory devices $110_1$-$110_N$. The processor(s) can be a central processing unit, microprocessor, integrated circuit, field programmable gate array, or other circuitry to read, write, and maintain memory content.

The host system 102 can be a computing device such as a desktop computer, laptop computer, network server, mobile device, a memory card read, an interface hub, or similar electronic device that includes a memory access device (e.g., a set of processors). A 'set,' as used herein, refers to any positive whole number of items including one item. In one embodiment, the device 100 is a personal computer and the host system 102 comprises a central processing unit that carries out the instructions of a computer program by performing the basic arithmetic, logical, control and input/output (I/O) operations specified by the instructions. One or more of these instructions is stored in and/or requires access (e.g., read or write access) to user data stored in the memory devices $110_1$-$110_N$. Accordingly, the host system 102 requests access to the memory devices $110_1$-$110_N$ via commands or instructions passed to the controller 108 via a host interface 114.

The memory system 104 can include volatile memory devices, non-volatile memory devices, or a combination of volatile and non-volatile memory devices. The memory system 102 can be a storage system (e.g., solid-state drive (SSD)) to be used for data storage in the device 100. As a storage system, the memory system 104 can include memory devices $110_1$-$110_N$ that are non-volatile memory devices. For example, the memory devices $110_1$-$110_N$ may be a negative-and (NAND) type flash memory. Each of the memory devices $110_1$-$110_N$ can include one or more arrays of memory cells such as single level cells (SLCs), multi-level cells (MLCs), or quad-level cells (QLCs). Each of the memory cells can store bits of data (e.g., data blocks) used by the host system 102. Although non-volatile memory devices, such as NAND type flash memory, are described, the memory devices $110_1$-$110_N$ can be based on any other type of memory. For example, the memory devices $110_1$-$110_N$ can be, but are not limited to, random access memory (RAM), read-only memory (ROM), dynamic random-access memory (DRAM), synchronous dynamic random-access memory (SDRAM), phase change memory (PCM), magneto random access memory (MRAM), negative-or (NOR) flash memory, and electrically erasable programmable read-only memory (EEPROM).

In one embodiment, memory devices $110_1$-$110_N$ are a cross-point array of non-volatile memory cells. Cross-point non-volatile memory can perform bit storage based on a change of bulk resistance, in conjunction with a stackable cross-gridded data access array. Additionally, cross point non-volatile memory can perform a write in-place operation (in contrast to many Flash-based memory), where a non-volatile memory cell may be programmed without the non-volatile memory cell being previously erased.

The host system 102 can be coupled to the memory system 104 via a host interface 114. In one or more embodiments, the host interface 114 is a standardized physical interface. For example, when the memory system 104 is used for data storage in the computing system 100, the host interface 114 can be a serial advanced technology attachment (SATA) interface, a peripheral component interconnect express (PCIe) interface, or a universal serial bus (USB) interface, Fibre Channel, Serial Attached SCSI (SAS), among other standardized connectors and interfaces. The host system 102 can further utilize an NVM Express (NVMe) interface to access the memory devices $110_1$-$110_N$ when the memory system 104 is coupled with the host system 102 by the PCIe interface. In some embodiments, the memory system 104 is a hybrid memory/storage system.

The host interface can provide an interface for passing control, address, data, and other signals between the memory system 104 and the host system 102. In general, however, the host interface 114 is comprised of any set of circuitry and protocols that provide an interface for passing control, address, data, and other signals between the memory system 104 and the host system 102.

The controller 108 communicates with the memory devices $110_1$-$110_N$ to read or write user data, program data and similar data. The controller 108 includes a set of integrated circuits and/or discrete components, and/or code/instructions for managing/controlling the memory devices $110_1$-$110_N$. The controller 108 includes hardware, firmware, and/or software to perform ECC operations on data stored in the memory devices $110_1$-$110_N$. The EEC 130 can be internal to the controller 108 or, in other embodiments, can be a discrete component separate from the controller 108. The ECC 130 is an integrated circuit that can include firmware and micro-coding to perform ECC operations. ECC 130 operations can include operations to correct errors in the memory devices $110_1$-$110_N$ The ECC 130 includes a product code decoder (PCD) 150 that utilizes product codes as an organization of data and parity data to perform error correction on the memory devices $110_1$-$110_N$ The PCD 150 is described herein below in greater detail with relation to FIG. 3.

The use of a PCD 150 mitigates the problems of traditional ECCs by exploiting the subdivision of one large product-code into many small component codes of limited correction capability. These small codes, which are typically short Bose, Chaudhri, and Hocquenghem (BCH) codes, are organized into a cross-checking matrix structure within a higher-level product code, which enables the use of multiple-iteration, turbo-style decoding to provide error correction power close to that of a conventional decoder in an ECC, but with a much lower implementation cost due to the reduction of the hardware components that process the individual component codes. This makes PCDs a good match for controllers that have restrictive area and power budgets, but which still need to handle high raw bit-errorrates (RBERs) and meet aggressive bandwidth and latency targets. The embodiments provide an ECC using a PCD based microarchitecture and provides solutions to the issues and challenges involved in implementing a PCD 150 for an ECC 130 in a controller 108.

Figure 2:
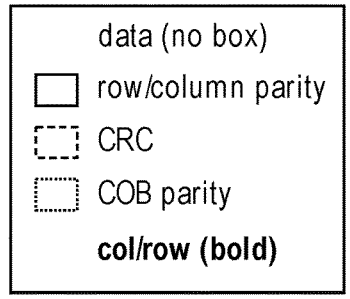
FIG. 2 is a diagram of an example product code.

FIG. 2 is a diagram of an example product code. This example product code is used herein for sake of explanation and not limitation. The example product code is provided for clarity and conciseness to explain the operation of the ECC and PCD decoding process. One skilled in the art would understand that a product code of varying dimensions and characteristics can be utilized consistent with the principles, structures, and processes described herein.

In the example product code, 720 Bytes of data and parity are organized into a matrix of 24 row and 24 column BCH component codes. Each row and column has 192 bits of data and 24 bits of parity (N=216, K=192, where N is the total number of bits in each component code, and K is the number of bits in each code not including parity bits), and each BCH component codeword can have up to three correctable errors, requiring that the 24 parity bits for each row and column be organized as three 8-bit values (T=3, M=8, where T is the number of correctable errors in each component code, and M is the rounded-up log [base 2] of the total number of bits in each code). In other embodiments, product codes with differing ratios of data and parity bits as well as differing number of correctable errors can be utilized. In this example product code, there is an 8-bit intersection (or crossover) of data between any given row and column. For maximum correction ability, the intersection would be only 1 bit, but that would lead to a more rigid matrix structure of many more, smaller component codes that would make it hard to define specific code-rates and codeword sizes, so the embodiments utilize a larger crossover size (8-bits in the example), which allows the use of fewer but larger component codes that provide more flexibility.

The basic decoding flow for a product code starts with BCH syndrome generation for each row and column code from the initial data received at input, followed by the iterative decoding and adjustment of those syndromes of each row and column, to identify up to three correctable bit-errors in the product code per row or column (in this example) per iteration, requiring correlated corrections to the underlying data. Syndrome decoding is an efficient method of decoding linear code (e.g., BCH code) and is a type of minimum distance decoding using a reduced lookup table of possible error patterns. Columns or rows of the product code that are uncorrectable during one iteration can have some of or all their errors fixed when their intersecting rows or columns respectively are corrected and can therefore become correctable during the next iteration. Syndromes provide information on the error state of each row or column codeword or more precisely the state of each parity check equation comprising a row or column code, where 1s in the syndromes indicate the presence of errors, and all-zero syndromes indicate there are no errors. This process is described in more detail herein below with relation to FIGS. 3 to 5.

An important factor in the compactness of a PCD is that only the syndromes of the component codes, rather than their actual data, are used in each processing stage of the iterative decoding flow. In this example, there is a 9:1 ratio between the length in bits of a component code (216 bits) and the size of its syndromes (24 bits), leading to a dramatic decrease in the size of the hardware structures needed to both process and store decoding states compared to, e.g., a low-density parity code (LDPC) decoder which operates directly on the data itself.

Small BCH component codes are subject to high miscorrection rates, which although mitigated by the iterative row/column cross-checking, can still occasionally lead to the presence of undetected errors after an apparently successful decode. These cases are caught by embedding a cyclic redundancy check (CRC) code in each product code at encode time to provide a unique data signature. The CRC code is regenerated at decode time and matched against the embedded CRC value as an extra data integrity check.

As used herein, a product code is a data structure as shown in FIG. 2 that consists of all the data and parity bits of the 24 column component codes and 24 row component codes. The data bits are shared between rows and columns. A component code is all the data and parity bits of just one of the 24 row or 24 column BCH codes, being 216 bits in length in the example of FIG. 2. Syndromes of a row or column component code are a representation of the error state of a component code, and they are initially generated by the syndrome generators by processing each row or column code's incoming data and parity bits, and then updated during the iterative correction process. BCH codes encode information on both the number and location of up to "T" errors, and the number of syndromes for each component code is equal to the maximum number of correctable bits in a component code, so in this example, there are 3 8-bit syndromes generated by the syndrome generators for each column and row, since up to three errors can be corrected in each (T=3).

Figure 3:
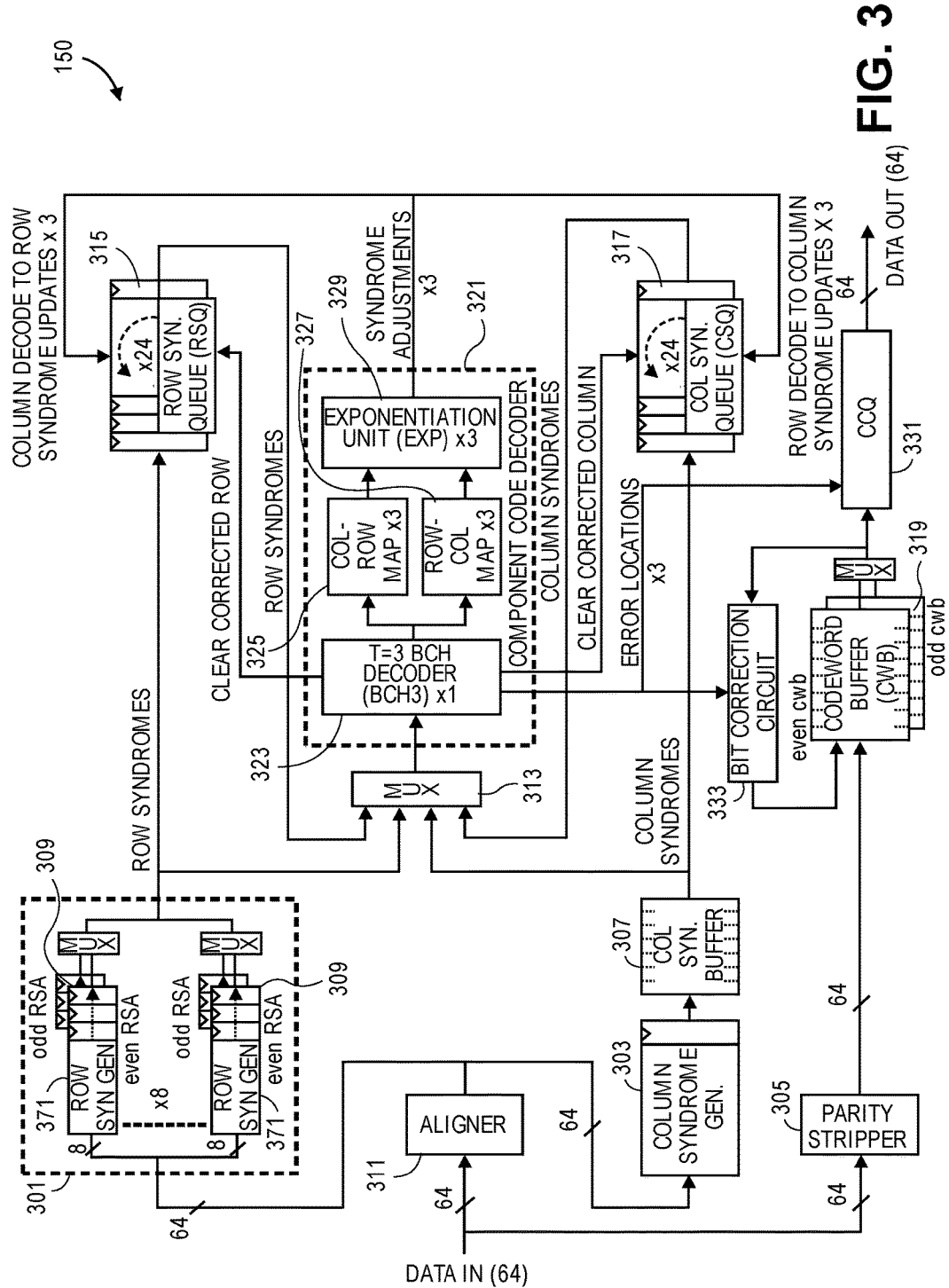
FIG. 3 is a diagram of one embodiment of a product code decoder (PCD) to decode a product code for an ECC.

FIG. 3 is a diagram of one embodiment of a PCD 150 to decode a product code for an ECC. This simplified block diagram is an example of a product decoder capable of decoding the product code presented in FIG. 2. The product code to be corrected is stripped of its parity data by a parity stripper 305 and stored in a codeword buffer (CWB) 319. This product code data in the CWB 319 is corrected during the parallel processing of the same product code in the other stages of the PCD 150. Once the PCD 150 corrects the product code data in the CWB 319, the PCD 150 outputs the corrected product code data.

In parallel with the storage of a copy product code's data in the CWB is a processing of another copy of the product code to identify the location of errors in the product code that are then corrected in the copy (minus the parity bits) stored in the CWB. The first stage of processing an input product code data to find errors is syndrome generation. Data in the form of a product code arrives at the input of the PCD 150 during a time period based on the size of the product code. In this example, data is input at a rate of 64-bits per clock, and its ordering with respect to the product code layout follows a column-by-column trajectory, so that the first group of four incoming 64-bit words supplies data and parity bits for column 0 (see FIG. 2), the second group of incoming 64-bit words supplies data and parity bits for column 1, and so forth until all the columns are input.

With this data ordering, a single 64-bit column syndrome generator 303 can be used to form the syndromes for each of the 24 column codes as the data streams into the PCD 150, at a rate of one set of syndromes every three or four incoming 64-bit words of data. In some cases, the groups of incoming 64-bit words can overlap two columns. An input aligner 311 organizes and corrects for this overlap such that a complete column of data is provided to the column syndrome generator 303 before data for the next column is provided to the column syndrome generator. Thus, the input aligner 311 orders the input data to be column aligned before being input into the column syndrome generator 303. A column syndrome buffer 307 stores each column's syndromes after their generation. The component code decoder (CCD) 321 processes the column syndromes from the column syndrome buffer 307. The column syndrome queue (CSQ) 317 also receives a copy of the column syndrome input to the CCD 321.

While the input data, a product code, is input into the column syndrome generation process, the row syndrome generation is also performed. The row syndrome generation is more complicated in this example because the product code organization dictates that each incoming 64-bit word is striped across up to eight rows at once, with each row receiving eight bits from each word. This is handled by using eight row syndrome generators 309, each of which updates the syndromes for one of the up to eight rows spanned by each incoming word. In this example, a row syndrome processor 301 manages row syndrome generation.

In this example embodiment, because data arrives in column order, all ninety 64-bit words in the example product code must be received to fully span any and all of the 24 rows, therefore intermediate (partial) syndrome values for all 24 rows must be stored and updated until the entire product code has been received. This is handled by a row processor 301, which includes eight row syndrome generators 371 to process a byte of data from each incoming 64-bit word for each of eight of the 24 rows at a time. After each incoming 64-bit word, these eight row syndrome generators 371 rotate between handling one of three different groups of eight rows to thereby handle the 24 rows of the product code. The resultant syndromes are stored in eight first in first out buffers (FIFOs) that store three entries each. Thus, there is a FIFO attached to each of the eight syndrome generators. Each of these FIFOs uses one entry of the three entries in the FIFO to store a syndrome belonging to a respective one of the three syndrome groups being sequentially generated by a corresponding row syndrome generator. These FIFOs are collectively known as the Row Syndrome Accumulator (RSA) 309. Each one of the eight RSA FIFOs feeds a partial syndrome back into its corresponding row syndrome generator from its output, and receives an updated partial syndrome from its row syndrome generator at its input after each incoming word is processed in combination with the partial syndrome supplied by its FIFO output. The RSA continuously rotates its three entries so that the partial syndromes for one of the three groups of syndromes are fed back to the row syndrome generators in coordination with the incoming 64-bit words of the product code that supply data for that group. A 'rotation' of the RSA is the movement of all three entries in each RSA FIFO such that the last entry is fed back to the row syndrome generator and the updated output of the row syndrome generator is pushed back into the input of each RSA FIFO. Finally, the 24-bit row parities are organized into byte-wide stripes in incoming words, so they can be handled by the row syndrome generators as if they were the same as data.

Since each row spans most of an incoming product code, final syndrome values for each row become available in the RSA only when the PCD receives the entire product code, after which the syndromes for one row per clock are sent to, and are decoded by the CCD 321, and are also stored in a Row Syndrome Queue (RSQ) 315. In some embodiments, additional buffering to support pipelined processing of incoming back-to-back product codes is provided by having duplicate RSAs. As discussed further herein below with relation to FIG. 6 the two sets of RSAs are referred to as the odd and even RSAs. A set of multiplexors are connected with the two sets of RSAs. The row processor 301 drives the multiplexors to control the output of row syndromes to the CCD 321 and RSQ 315.

The PCD processes the row and column syndromes in the Component-Code Decoder (CCD). The CCD is responsible for decoding each individual row and column component code during each decoding iteration. The CCD is organized as a pipeline consisting of three major sets of components: a single, T=3 (indicating a number of locations that can be corrected, here 3), BCH decoder (BCH3) 323, followed by a set of three column-to-row mappers 324 and three row-to-column mappers 327, and followed by a set of three exponentiation units (EXP) 329. The BCH3 decoder 323 takes a set of three syndromes for each row or column component code and decodes them to produce up to three error locations within each component code. If there are more than three errors in a codeword, the CCD will either report it as uncorrectable or will miscorrect it, and further iterations are carried out to correct the codeword until the PCD successfully corrects the codeword or determines that the codeword cannot be corrected.

The BCH decoder 323 sends the locations of correctable errors to a set of bit correction circuits 331, 333. The bit correction circuit 331 is connected to the data out and codeword buffer 319. The bit correction circuit 333 is connected to output of the CWB 319. The BCH decoder 323 is connected to a set of three column-to-row mappers 325 (if columns are being decoded) and row-to-column mappers 327 (if rows are being decoded). These mappers translate the locations of up to three errors in a column or row to their equivalent locations in the row or column, respectively, that are at the intersection of each error. The mappers send the translated error locations to the three exponentiation (EXP) units 329, which perform a "reverse" BCH decode, producing three syndrome adjustments for each of the three mapped error locations. Where the input syndrome is a column syndrome, the EXP units 329 produce up to three row syndrome adjustments for adjusting the syndromes of up to three rows at the intersections of up to three errors in the decoded column. Where the input syndrome is a row syndrome, the EXP units 329 produce up to three column syndrome adjustments for adjusting the syndromes of up to three columns at the intersections of up to three errors in the decoded row. The CSQ 315 and RSQ 317 then process the syndrome adjustments output by the exponentiation units 329. The CSQ 315 XORs the column syndrome adjustments received from the exponentiation unit 329 with the existing syndromes of up to three columns to update them for each of up to three corrected errors in a decoded row. Similarly, the RSQ 317 XORs the row syndrome adjustments received from the exponentiation units 329 with the existing syndromes of up to three rows to update them for each of up to three corrected errors in a decoded column.

The small size of the CCD 321 enables the area efficiency of the PCD 150. The short length of each component code, and the limited required correction ability (T=3 in this example), allows for the area efficiency optimizations. The small size of the CCD 321 enables the entire PCD 150 to be only a fraction of the size of a traditional high-T BCH decoder (i.e., a BCH decoder that can correct a large number of errors) that would typically be used to provide correction across an entire component code in one pass. Additionally, the relative simplicity of the CCD 321 allows it to be sufficiently deeply pipelined to permit the initiation and completion of one component-code decode every single clock cycle, thus maximizing its utilization efficiency.

To support the PCD's iterative control flow, memory structures in the RSQ 315 and CSQ 317 store the syndrome states for each of the twenty-four rows and columns, respectively. the RSQ 315 and CSQ 317 receive the initial syndromes from the corresponding syndrome generators and provide the current syndromes states for each row or column to the CCD 321 during each iteration, as well as recording the syndrome adjustments made by each error corrected by the CCD. The entries of the CSQ 317 and RSQ 315 can be accessed both sequentially for providing column-by-column or row-by-row syndromes for decoding by the CCD 321, or at random for updating column or row syndromes that have been mapped and reverse-decoded for adjustment by the EXPs 329.

The CSQ 317 and RSQ 315 are constructed to maximize area efficiency for the PCD. In one embodiment, the CSQ 317 and RSQ 315 are flip-flop-based shift registers, using one register per set of syndromes for each column or row. These registers can be either loaded with the initial syndromes from the syndrome generators during the first iteration, or rotated to provide the current syndrome states to the CCD 321, while still preserving the syndrome values during subsequent iterations. Similar to the RSAs, the RSQ 315 and CSQ 317 'rotate,' such that a value in each entry is moved to the next entry. The value in the last entry of the queue is placed at the first entry. A 'rotation,' is one iteration of this movement of values in the queues. Additionally, for supporting random column or row syndrome adjustments from the CCD 321, the CSQ 317 or RSQ 315 include circuitry to simultaneously XOR up to three received syndrome adjustments with the current values of any of up to three entries in the CSQ 317 or RSQ 315 selected by column or row numbers provided by the EXPs 329. The operations of the CSQ 317 and RSQ 315 are further described with relation to FIG. 6.

The CCD 321 iteratively decodes input product codes by making corrections column by column and then row by row, as long as the corrections in a given column or row involve three or fewer errors. The CCD 321 works primarily to process data in the syndrome domain. The column syndrome generator 303 and the row syndrome generators 309 convert incoming data and parities into column and row syndromes, respectively. The process of the CCD 321 identifies locations for corrections in the underlying product code data stored in the CWB 319. Bit-level data corrections are identified each time a row or column component code is decoded and applied to the product code that, at input, after removing the row and column parity bits, is placed in the 64-bit wide CWB, where it remains until ready for output. This data correction is complicated, because the CCD 321 can produce up to three corrections per clock, each of which could go to a random 64-bit location in the CWB 319, requiring the CWB 319 to be an area-expensive six-port structure to handle three read-modify-writes per clock if it is to keep up with this correction rate.

The embodiments mitigate the complicated correction of random locations in the CWB 319 by exploiting the fact that, in typical applications, most errors will be corrected by the first column iteration, since at reasonable raw bit-error rates (RBERs), most columns will initially have "T" or less errors and will therefore not defer corrections to subsequent iterations. This leads to a two-pronged approach for correcting data, as depicted in FIG. 3. First, error locations in first-iteration columns, in which there can be many errors, are pushed into a bit correction circuit referred to as a Column Correction Queue (CCQ) 331, which is a FIFO used to later correct data on-the-fly as it streams out of the PCD rather than during decoding. Due to the number of errors identified in the first column iterations, the CCQ 331 FIFO is sizable. It is complex and area expensive to perform these corrections at product code output. Second, error corrections produced by the CCD 321 during subsequent row and column iterations, which are normally few, are handled by the bit correction circuit 333. The bit correction circuit 333 queues corrections from the BCH decoder 323 and applies the corrections directly to data in the CWB during the decode. The bit correction circuit 333 is smaller and more area efficient than the CCQ 331. One implementation of bit correction circuit 333 is described in further detail herein below with relation to FIGS. 8 and 9. The CWB 319 I/O ports can usually keep up with the number of corrections produced by subsequent iterations, so no multiport structure is needed. In the rare cases where the CWB ports become overloaded, data output for completed decodes is simply stalled until all corrections have been made in the CWB. In some embodiments, to support pipelined processing of back-to-back incoming product codes, multiple CWBs can be utilized that are referred to as the even CWB and odd CWB. At any given time during pipelined processing of back-to-back incoming product codes, one CWB is utilized to store incoming data for a first product code and supply outgoing data for a second product code, while the other CWB is storing data for a third product code that is being corrected by the CCD 321. A multiplexor is attached to the output of the data to manage, which of the CWBs 319 is sending data to the bit correction circuits 331, 333 for modification. Once the product codes have been corrected in the CWB 319 by the bit correction circuit 333 for errors detected by row decodes and second iteration and subsequent column decodes, they are output to the CCQ 331. The CCQ 331 then performs its corrections resulting from the first-iteration column decodes before outputting the final corrected product code. The corrected product codes from the output of the ECC decoder are used to supply error-free data at the output of the controller, and can also be used by the controller to update and correct the corresponding memory channel devices of the memory device.

Figure 4:
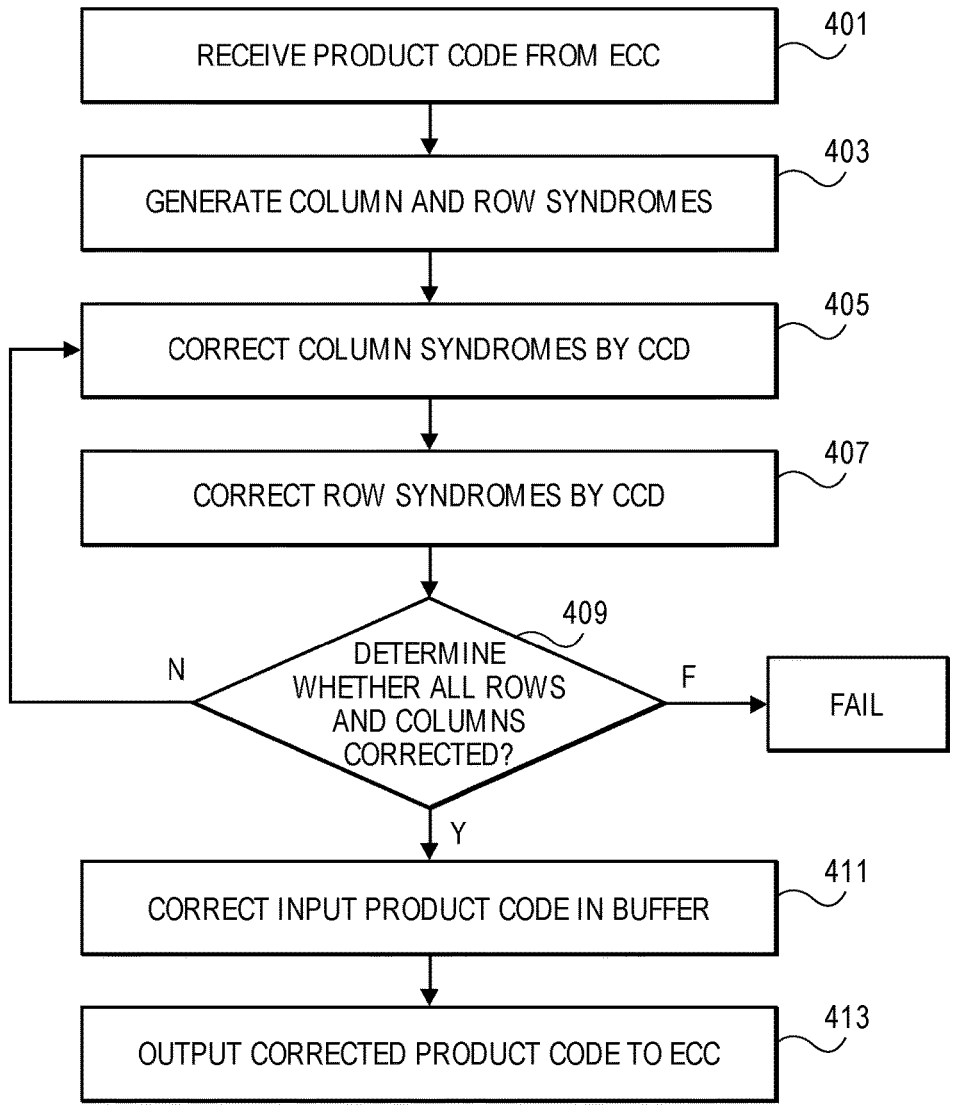
FIG. 4 is a flowchart of one embodiment of the PCD operation.

FIG. 4 is a flowchart of one embodiment of the PCD operation. The PCD operates on an input product code (Block 401). The input product code can be any size or dimension. The examples given herein are provided by way of illustration and not limitation. In the examples, the product code is 720 bytes of data having a 64-bit structure, which enables it to be processed in 64-bit portions by the PCD. The input product code has a matrix structure that is utilized to generate column and row syndromes for each row and column in the product code (Block 403). The CCD processes each column syndrome to identify and correct errors in the input product code, as described in further detail herein above with relation to FIG. 3 (Block 405). If a given column has more than a threshold number of errors (e.g., three errors as described with reference to FIG. 3), however, the column cannot be corrected and is left uncorrected. After the CCD processes all column syndromes, the CCD processes the row syndromes to identify and correct errors in the input product code (Block 407). As with columns, if a row has more than a threshold number of errors, then it cannot be corrected and is left uncorrected. After the CCD processes all column syndromes and all row syndromes, the RSQ and CSQ determine whether all the row and column syndromes have been successfully corrected (Block 409). If all the errors have not been corrected, then another iteration can be carried out (by returning to Block 405). If all the errors have been corrected, then the CCD can update the input product code using the correction location information determined from the correction of the column and row syndromes (Block 411). The product code data is updated using location information derived from the processing of column syndromes and row syndromes. The correction of the product code data can be accomplished in parallel with the processing and updating of the column and row syndromes, as described with relation to the example PCD of FIG. 3. In other embodiments, the correction of the product code data using the location information can be implemented asynchronously or after the processing of the column syndromes and row syndromes. In the case where there is an error where a threshold number of iterations cannot resolve the error in the column and/or row syndromes, then the PCD can indicate a failure has occurred to the ECC. For example, the PCD can track the number of iterations and compare the tracked number against a threshold value. If the PCD successfully corrects the product code, then the PCD can output the product code to the ECC (Block 413), which in turn can utilize the corrected product code to implement error correction in the memory channel devices associated with the product code.

Figure 5:
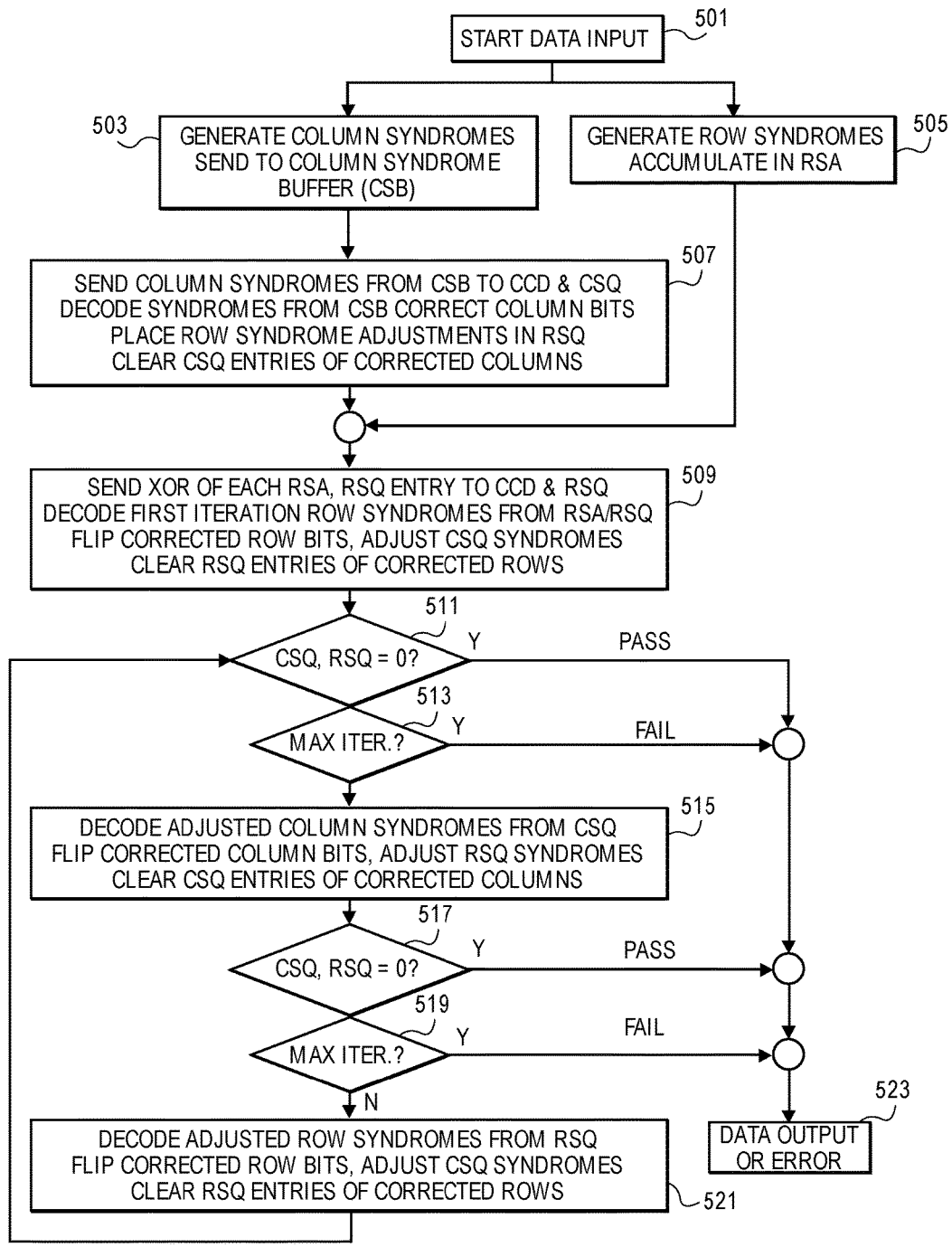
FIG. 5 is a flowchart of an example implementation of the process of the PCD as illustrated in FIG. 3.

FIG. 5 is a flowchart of an example implementation of the process of the PCD as illustrated in FIG. 3. The flowchart of FIG. 5 is provided as a specific example implementation of the process outlined by FIG. 4. As described above, product code data to be corrected flows into the PCD 64 bits at a time (Block 501), and is simultaneously sent to the CWB, the row processor, and the column syndrome generator. Blocks 501-509 are carried out by the PCD as a first iteration or pass on correcting the product code data that goes column by column and then row by row to correct as many columns and rows as possible.

The column syndrome generator receives product code data in column-by-column order, and generates a set of column syndromes (Block 503) for a column every three or four clocks that is buffered in a column syndrome buffer (CSB). The CSB sends a column syndrome to the CCD and to the CSQ (Block 507). The CCD decodes the received column syndromes and produces column data corrections as well as row syndrome adjustments. The CCD sends row syndrome adjustments to the RSQ whenever a column is correctable. If a column is correctable, then the corresponding column syndrome in its CSQ is set to zero to indicate it has no remaining errors.

While the first iteration column decodes are processed, the row processor accumulates the row syndromes in a set of RSAs (e.g., all rows are ready upon input completion) (Block 505). The RSQ sequentially XORs the row syndromes input from the RSA and the row syndrome adjustments from the CCD that were generated by the first iteration column decoding. (Block 509). On completion of first iteration column decode processing by the CCD, the RSQ sends the adjusted row syndromes to the CCD for decoding. The row syndromes sent to the CCD are also rotated back to the front of the RSQ for use in further iterations. The CCD decodes the first iteration row syndromes and makes row data corrections. The CCD decoding of the row syndromes also produces column syndrome adjustments, which the CCD applies to the column syndromes stored in the CSQ. When the CCD detects that a row is correctable, it sets the RSQ entry for that row to zero to indicate it has no remaining errors. The first iteration is then complete.

If, after the first iteration, all column syndromes in the CSQ and all row syndromes in the RSQ are zero (Block 511), the PCD determines the decode is successful and complete. If all the row and column syndromes in the RSQ and CSQ have not been zeroed out, the PCD performs one or more subsequent iterations (Blocks 515 and 521). For those iterations, all row and column syndromes are already available in the RSQ and CSQ, so the row and column syndromes are rotated into the CCD for decoding. The CCD clears the RSQ or CSQ entries of successfully decoded rows or columns, and adjusts up to three mapped column or row syndromes in the CSQ or RSQ, respectively. The PCD successfully terminates the decoding when all CSQ and RSQ syndromes become zero (Blocks 511 and 517). The PCD unsuccessfully terminates the decoding if all CSQ and RSQ syndromes are not all zero after a maximum permitted number of iterations (Blocks 513 and 519). In some embodiments, differing numbers of iterations can be performed on columns and rows, such that a threshold checked in Block 513 differs from the threshold checked in Block 519. Where all the row and column syndromes have been successfully updated, then the correlated product code locations are updated in the CWB by bit correction circuits. The update of the CWB is performed in parallel by location identification output of the CCD. The operation of the bit correction circuits to update the CWB is described in further detail with relation to FIG. 8. Where the CCD has successfully updated product code data it can then be output (Block 523). Where the CCD has failed to completely correct the product code, then the PCD indicates an error, but can still output uncorrected data for a possible further correction attempt by a different, downstream ECC block that uses some alternative correction code and mechanism other than product code correction.

Figure 6:
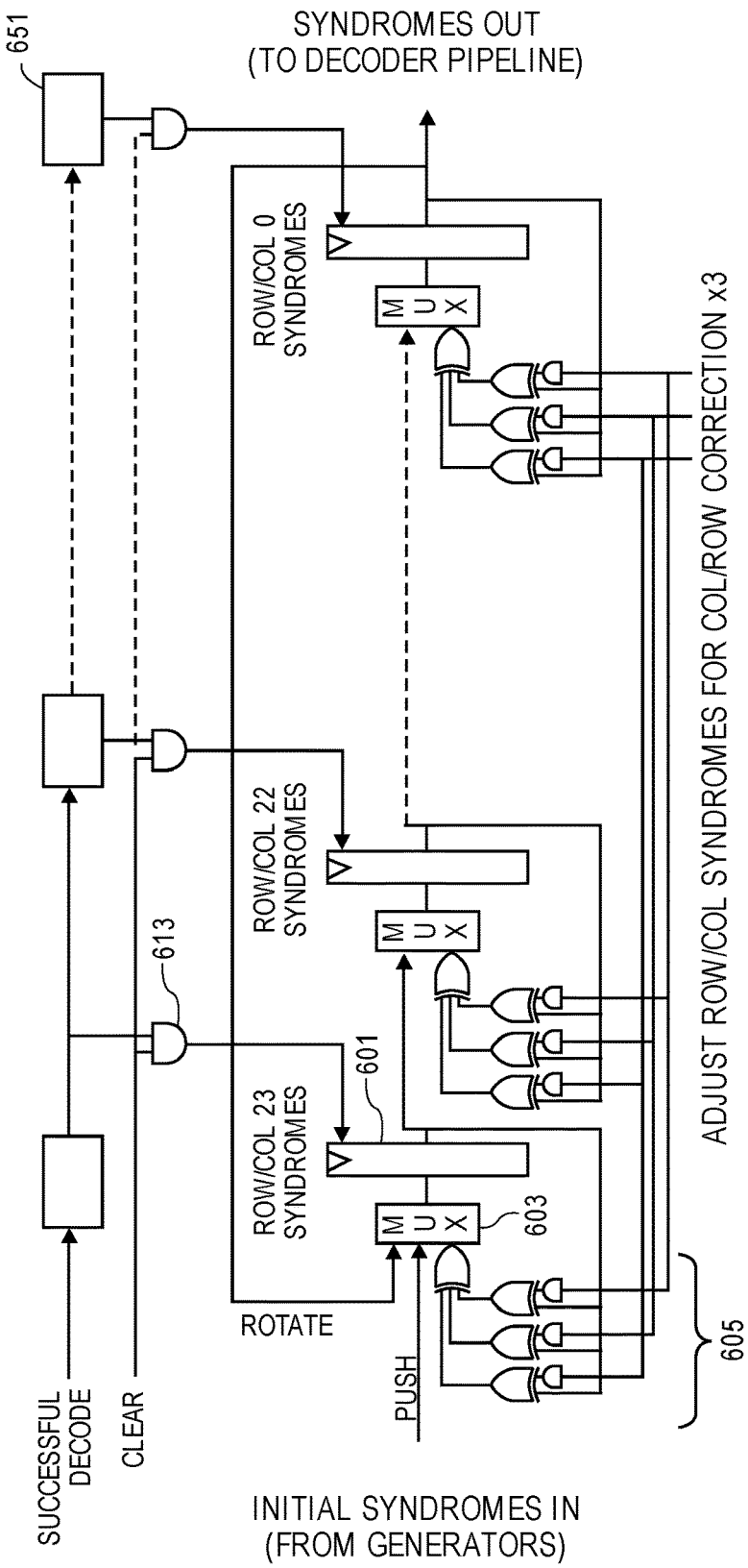
FIG. 6 is a diagram of one embodiment of a row syndrome queue (RSQ) or column syndrome queue (CSQ) implementation.

FIG. 6 is a diagram of one embodiment of an RSQ or CSQ implementation. In one embodiment, the RSQ and CSQ have an identical construction. An RSQ or CSQ includes a set of registers 601 for storing row or column syndromes, respectively. The RSQ or CSQ can include any number of registers 601 based on the size and structure of the product code. In the examples utilized herein, there are 24 rows and columns for the product code and thus 24 registers for corresponding column and row syndromes in each RSQ and CSQ. The RSQ or CSQ operate as a shift register such that an input comes into a first register 601 and can be rotated to other registers in order and back to the original register. The input into each register is managed by a multiplexor 603 and a set of XOR gates 605 is present to enable modifications to a set of registers based on location information provided by the CCD. In other embodiments, a different number of gates can be utilized to support varying numbers of locations that are corrected and the variations of product code size.

The RSQ and CSQ are designed to have three modes of operation, a shift mode, a rotation mode, and an update mode. The PCD can control the mode of operations via control signals to the multiplexors 603. The 24 registers are organized as a serially connected shift register, in one example with registers 0 through 23. Register 0 can be the head of the queue, which provides the RSQ or CSQ output. Register 23 can be the tail of the queue. New syndromes are loaded into the tail of the queue at register 23. In some embodiment, the RSQ and CSQ are configured such that any three registers can be updated at a given time, i.e., simultaneously. Any combination of the registers can be updated by the CCD, which provide three register addresses 0 to 23 and 3 update syndrome values to be placed in the respective registers. The three updated syndromes are exclusive OR'd (XOR'd) with the current content of the registers to implement the updates from the CCD by performing a Galois Field addition.

In shift mode, the new syndromes are provided by the row or column syndrome generators and are pushed into the tail register of the queue. As each syndrome is stored, all other registers are shifted down toward the head of the queue. This shift mode operation is performed during the first iteration of the CCD when syndromes are first generated and have to be initially entered into the respective queues. In this shift mode for the RSQ, during the first iteration, before the row syndromes for each row from the row syndrome generator are pushed into the tail of the RSQ they are first XOR'd with each row's corresponding row syndrome adjustment values at the head of the RSQ so that the row syndrome adjustments that were previously placed in the RSQ during column decoding of the CCD while the RSQ was empty are thereby dynamically applied to the row syndromes as they are initially input into the RSQ. This avoids the expense of having to store those initial row syndrome adjustments in a separate memory structure.

Rotation mode is utilized by the queues during iterations of the CCD after the first iteration, when all syndromes have already been loaded into the queues. The rotation mode shifts the syndromes in the registers of the queue into the CCD and back into the respective queue for subsequent iterations on these syndromes. The syndrome values are simultaneously shifted out at the head of the queue and into the CCD and placed back at the tail of the respective queue to preserve them for further updating and processing in future iterations.

In an update mode, the queues receive up to three register numbers that identify the registers to be updated. The register numbers are received from the CCD along with a corresponding number of update values. The identified registers receive the update values and XOR these values with the contents of the registers to perform a Galois field addition of the existing register contents and the update values. The register identifiers do not have to be unique, i.e., two or more updates can be directed to the same register, in which case the two or more updates along with the original values in the registers are XOR'd together to provide the final value to be stored in the identified register. This update mode is used to update row syndromes in the RSQ caused by column corrections that overlap with row data bits represented by those row syndromes, and to update column syndromes in the CSQ caused by row corrections that overlap with column data bits represented by those column syndromes. In some embodiments, the logic for performing the XOR can be duplicated for each register as illustrated for layout efficiency and to enable updates to occur simultaneously.

These modes of operation for the queues are used at different times for the operation of the PCD during the decoding process and do not interfere with one another. Thus, an update does not occur while the queue is being shifted or rotated. In one embodiment, the syndromes for each row or column are in the RSQ or CSQ register number which corresponds to the respective row or column number, facilitating identification of the correct entries to update.

When the RSQ or CSQ are operating in shift or rotation modes, the syndromes associated with specific rows (for the RSQ) and columns (for the CSQ) are cleared when a successful row or column decode occurs. These successful corrections can occur while the RSQ or CSQ is in a 'disordered' intermediate shift or rotate state where syndromes for a given row or column are changing their internal locations inside the RSQ or CSQ, making it difficult to identify a register for a given row or column until the RSQ or CSQ returns to an 'ordered' state in which each row or column is in an RSQ or CSQ register that numerically corresponds to the row or column number of the product code. In one embodiment, the PCD mitigates this issue by delaying execution of 'clear' commands from the decoder until completion of row or column decodes when the RSQ or CSQ is back in its ordered state. The RSQ and CSQ return to their ordered state as a result of a full rotation of the 24 entries for sending each entry value to the CCD. After the RSQ and CSQ have returned to their ordered state the clearing of bits is carried out. This can be implemented by recording 'clear' commands from the CCD in a shift register 651 inside the RSQ or CSQ that has 1 bit per row (for the RSQ) or 1 bit per column (for the CSQ). Each time a row or column is decoded, a 1 or a 0 is pushed into that RSQ or CSQ 'clear syndromes' register 651 to indicate whether the syndromes of that row or column are to be cleared once the row or column decodes for the current iteration are finished and the RSQ and CSQ is in its ordered state. When the queues are in their ordered state, a CCD can issue a command to the queue to clear each register with a set 'clear' bit in the shift register 651 to complete this clear process. In one embodiment, shift register 651 values are logically AND'ed with the clear signal from the CCD to drive a clear signal for each of the registers 601. This mechanism avoids having to implement a more complex, gate-intensive mechanism to track entries for a specific row or column as they are shifted or rotated in the queues so that more immediate clears can be carried out.

The configuration of the RSQ and CSQ as a serial shift register with an optional loop-back from head to tail, and a set of XOR update logic duplicated across the registers of the queues, allows for an efficient connectivity within the internal queue structures, and permits high-speed parallel update operations to occur compared to if a conventional memory with a single read and write port was used as a way of optimizing area while impeding performance.

In some embodiments, the PCD performs a low latency CRC of the product code. The addition of a CRC check protects against miscorrection of a product code (i.e., a 'correction' to the product code that is incorrect due to limitations in the process). One problem with this is that the PCD must regenerate a CRC value to be compared against the embedded CRC using data that has already been corrected. This means the CRC checker waits until decoding has finished, and all data has been corrected, before starting the CRC regeneration. This leads to the CRC status being delayed until after output of the last word of data. Such a delay can significantly add to overall system latencies, since actions such as starting corrected data output to an external agent must typically wait until CRC status is known.

Some embodiments provide the CRC status at the start of data output instead of the end, which is possible when the CRC regenerator operates on uncorrected data in parallel with decoding. In these embodiments, the CRC process compensates for errors dynamically by adjusting the CRC value for data corrections as they occur. To support this, the CCD produces CRC syndrome adjustments to be applied "on-the-fly" to the regenerated CRC value. In these embodiments, the EXP unit(s) provide this function, producing CRC adjustments in a similar way to row and column syndrome adjustments. For example, the CRC regenerator produces a syndrome using the noisy data provided as initial input to the PCD and, as errors are detected and corrected by the CCD, the EXP unit(s) make adjustments to the CRC value regenerated using the noisy data. For adjusting CRC syndrome values to dynamically compensate for row and column corrections produced by the CCD, the row and column mappers within the CCD, in addition to their normal row to column or column to row error location mapping functions, also map the locations of errors within individual rows or columns at their inputs to locations that are relative to the start of the entire product codeword. The EXP unit(s), in addition to producing the normal row or column syndrome adjustments, then also use these error locations which are relative to the start of the entire product code to produce corresponding CRC syndrome adjustments. These adjustments are immediately applied to the regenerated CRC value, which therefore becomes ready at the same time as decode completion. As a result, the CRC pass or fail status becomes known at the start of data output.

Some embodiments also provide crossover region correction. Using product codes with multiple-bit row/column crossover regions allows for much greater flexibility in defining code-rates and codeword lengths than codes with single-bit crossover regions, but it has the disadvantage of introducing more error-distribution sensitivity into the probability of a decode failing. An example of this is when there are more than "T" errors (three in the examples) in a crossover region, making both the intersected row and column uncorrectable no matter how many iterations are performed to decode in the CCD.

One of the most common pathological cases for a failed decode is when all remaining errors are in one single crossover region. By addressing this case, a significant boost in correction ability can be attained. However, by definition, this case cannot be handled by the regular BCH decoder, therefore some embodiments include a different correction mechanism specifically for correcting greater than "T" errors in a single crossover region. Such a mechanism comprises a single embedded Crossover Byte (COB) that is generated and embedded in the codeword at encode time by separately XORing together all the data bits from each one of the 8 bit-positions in all the 8-bit row/column crossover regions, thus effectively producing parity bits (eight in this example) that are usable for correcting up to 8 errors in a single remaining crossover region in error.

The PCD regenerates the embedded COB value from corrected incoming data and, if at the end of a failed decode a single bad crossover region is detected by there being just one CSQ and one RSQ entry with non-zero syndromes, then correction of the detected bad crossover region is attempted. The PCD attempts correction of the bad crossover region by using mismatching bits in the embedded and regenerated COB byte as an 8-bit correction mask for the cross-over region of the row and column in error. The CCD's EXP units provide row and column syndrome adjustments for those crossover region error locations. If the application of adjustments to the syndromes of the one bad entry in each of the CSQ and RSQ results in those syndromes becoming zero, then the COB correction was successful. If they are still not zero, then the remaining errors may not have been in the crossover region, or they may have been the result of miscorrection, in which case the decode still fails.

Some embodiments of the PCD support codeword-level streaming. The PCD components determine the latency of decoding a single codeword based on the algorithmic operations required to correct it before output. However, most decoders must support back-to-back streaming at input and output, which is not possible if resources locked up by the decoding of one product code are simultaneously required by the next incoming product code. The PCD of embodiments described herein has two distinct processing phases: the syndrome generation phase (1) and the iterative decoding phase (2). These phases nominally last the time it takes to receive a product code and occur in parallel when back-to-back I/O streaming of product code is supported. This would be a problem if, for instance, embodiments only included a single RSA (Row Syndrome Accumulator) or CWB (Codeword Buffer), because, under streaming conditions, each phase of back-to-back consecutive product codes would be contending for their use. The embodiments support more parallelism by double buffering the CWB and RSA (providing even and odd versions), and by providing a column syndrome buffer (CSB). These structures allow the column syndrome generator to store syndromes generated for one product code in the CSB if they cannot be sent directly to the CSQ and CCD when the CSQ and CCD are in use by the iterative decoding phase of a preceding product code. The row syndrome generators store their syndromes in a second RSA (even or odd) during the syndrome generation phase of one product code if the first RSA (odd or even) is busy providing row syndromes to the RSQ and CCD during the iterative decoding phase of a preceding product code. The incoming data of a product code in its syndrome generation phase is placed in a second CWB (even or odd) if the first CWB (odd or even) is occupied by a preceding product code that is in its iterative decoding phase.

Figure 7:
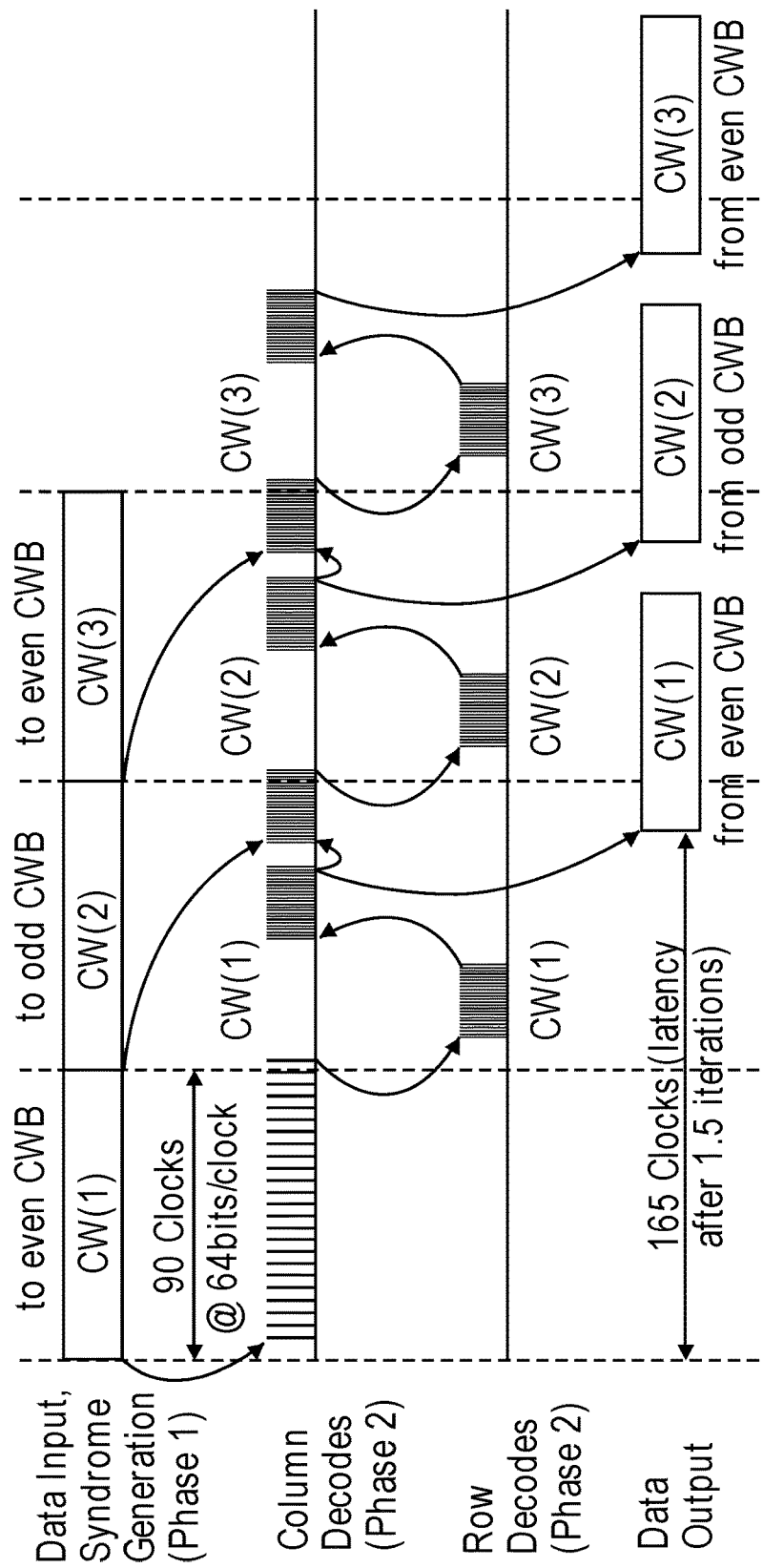
FIG. 7 is a diagram of one embodiment of the two-phase timing flow of the PCD.

FIG. 7 is a diagram of one embodiment of the two-phase timing flow of the PCD. Provided the syndrome generation phase and the iterative decoding phases do not last longer than the time it takes to receive a product code, pipelined operation of the PCD can sustain maximum I/O bandwidth indefinitely. If the decoding phase of a product code takes longer than a product code input time (e.g. due to extra iterations) then iterative decoding of the next product code, as well as input of the next product code after that, will be stalled while the decoder is busy. This stalling should be a rare event.

FIG. 7 illustrates the overlap of processing of successive incoming product codes that is made possible by the provision of extra hardware resources, namely the duplicate RSA, the duplicate CWB, and the CSB, in order to enable back-to-back pipelining of product code decodes. The diagram provides a timeline for Product Code 1 (CW(1)) and Product Code 2 (CW(2)) processing. It can be seen that the first row decode of CW1, which requires reading of row syndromes from the RSA and into both the RSQ and CCD overlaps with row syndrome generation for CW(2). If there were only one set of RSA registers, CW(2) row syndrome generation would corrupt the row syndrome values being read for CW(1) decodes. However, having even/odd RSA FIFOs eliminates this problem. Similarly, the diagram illustrates that, although column syndromes are generated on-the-fly while the product code streams in to the PCD (top line), the sending of first iteration column syndromes for CW(2) to the CCD (second line) is delayed from the start of input of CW(2) compared to first iteration decodes of CW(1) relative to the start of its input. This delay is due to the fact that the CCD is still busy processing CW(1) decodes while CW(2) column syndromes are being generated, and thus the CW(2) column syndromes must be temporarily stored in a buffer, i.e., the Column Syndrome Buffer (CSB), until the CCD becomes free after completing processing the final CW(1) iteration (which is the second CW(1) column iteration in this case). Finally, during CW(1) phase 2 decodes ($2^{nd}$ and $3^{rd}$ lines), the data for CW(1) must be held statically in the CWB for possible correction of data bits in it by the decode process and for later output, but simultaneously data for CW(2) is also streaming into the CWB during the CW(1) decodes. This would corrupt the CW(1) data in the CWB if an addition copy of the CWB was not provided in which to put the incoming CW(2) data while CW(1) data is still active in the CWB.

Thus, the embodiments provide a product code decoder that is area and power efficient. In one embodiment, the PCD can be implemented and synthesized to a target field programmable gate array (FPGA). The PCD is optimized by use of structures such as a lightweight BCH decoder and shift-register-based circular queues (RSQ and CSQ) to provide an area and performance competitive ECC solution compared to LDPC or traditional BCH decoders. The embodiments also handle issues of product codes, namely their susceptibility to miscorrection and pathological error distributions, through use of CRC codes and meta-checks such as the COB parity mechanism. Finally, the embodiments include hardware-supported decoding that can be augmented with double-buffered memories and FIFOs to provide high throughput, back-to-back streaming capability. Thus, the embodiments as described provide a product-code based ECC system in a non-volatile controller that is a very effective, low-cost solution as an alternative to an area and power intensive conventional ECC system.

Figure 8:
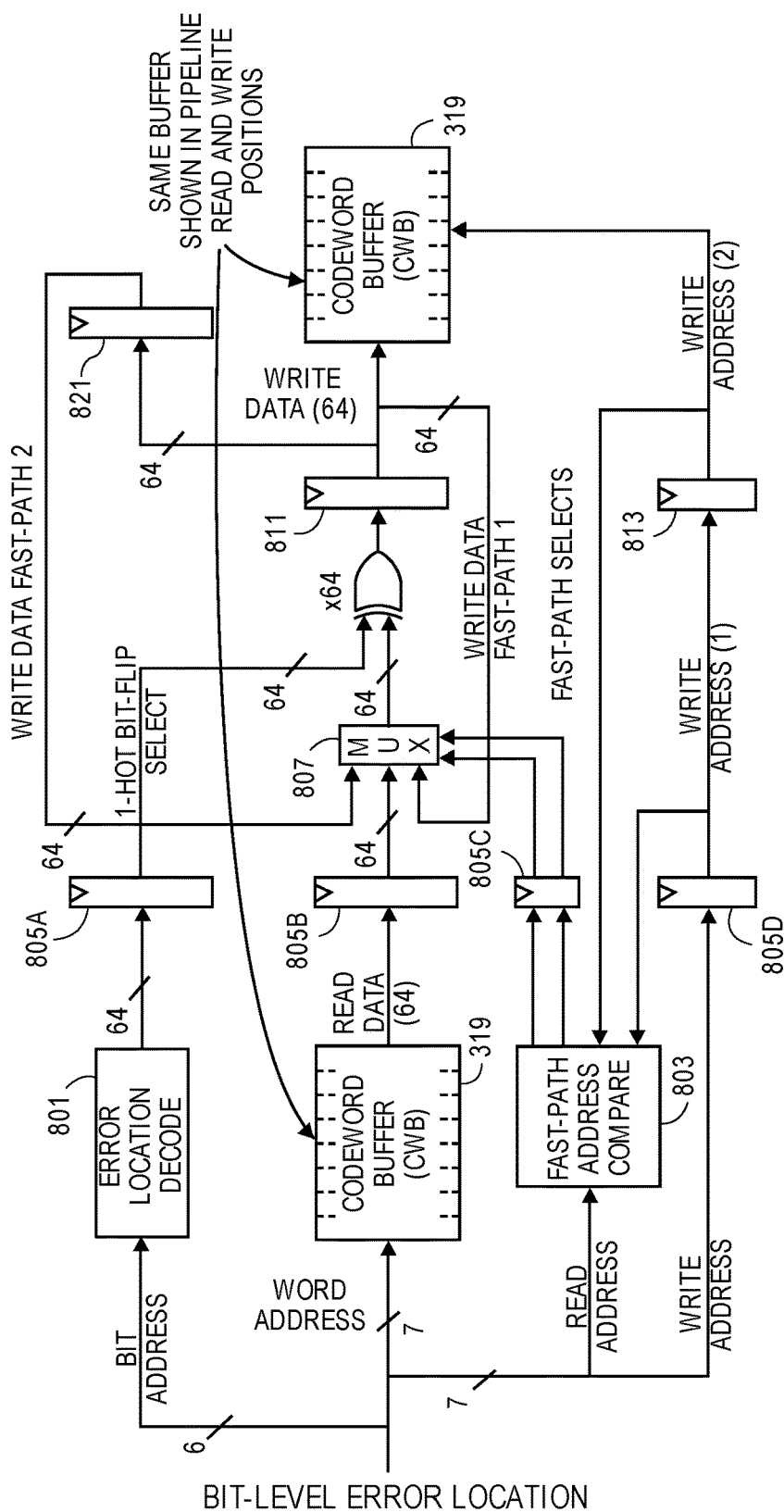
FIG. 8 is a diagram of one embodiment of a high throughput bit correction circuit for a PCD.

FIG. 8 is a diagram of one embodiment of a high throughput bit correction circuit for a PCD. The illustrated embodiment provides a mechanism to efficiently update or 'flip' corrected data bits that are corrected during the course of decoding by the CCD. The data is stored in the CWB while decoding takes place, but the decoding and correction processes of a product code can produce many bit-level data corrections. In some embodiments, up to three data corrections per clock cycle are generated in the examples provided herein. In other embodiments, larger numbers of corrections are generated and the mechanism is expanded accordingly. The bit corrections can be at random locations within the CWB. It would be inefficient in terms of cost, area, and power to design the CWB to handle any number of corrections at random locations at full bandwidth, requiring a complex multi-port structure to keep up with the correction rate. The embodiments provide a bit correction circuit with a single read and write port that is used to a maximum effect to support a target correction rate.

Thus, embodiments provide a bit correction circuit that handles high-frequency bursts of bit correction requests from a decoder (e.g., the CCD decoder) when decoding row or column codes to correct data bits that can be dispersed across any location in a data buffer (e.g., the CWB). Such high-frequency bursts of bit corrections could overload the ability of the data buffer to make the bit corrections fast enough to keep up with the CCD error correction rate. As such, the embodiments described below provide an error correction circuit that is efficient in terms of area, cost, and power while still supporting the error correction rate required by the CCD to avoid having the CCD stall during operation.

As discussed above, the data placed in the buffer that is to be corrected, e.g., in the CWB, is in 64-bit words. Incoming data is simultaneously converted to syndromes that are used to perform the actual decoding, such that data inside the CWB remains static and is not used during the decode process by the CCD other than to receive the error bit correction when the CCD detects an error. These error bit corrections can be identified by the CCD, in this example, at a rate of 3 errors per clock cycle. Each of these errors can be in different locations in the CWB. However, the CWB has just one read port and one write port and is unable to handle 3 corrections on a single clock cycle.

To handle these bursts of error bit corrections by the CCD the bit correction circuit, the error bit corrections are placed in a correction queue. In one embodiment, the correction queue is a FIFO buffer. The corrections are bit-level locations where the bits are to be corrected. The correction queue provides a place to store correction requests that cannot be immediately handled by the CWB because of its limited bandwidth. This provides time for the bit correction circuit to catch up with the processing of the corrections from the CCD. The bit correction circuit can then 'catch up' with the processing of errors during times that the CCD is not producing a high number of error corrections, such as during cycles in which rows or columns being decoded do not need any corrections or during idle periods between iterations on the product code being processed by the CCD.

The bit correction circuit also utilizes a correction pipeline that is attached to the CWB that allows correction requests to be handled by the bit correction circuit that are placed in the correction queue by the CCD with a guaranteed rate of one per clock cycle when used with a two-port memory for the CWB (one read-port, one write-port), regardless of the address distribution of the bits to be corrected in the CWB. This guaranteed rate is supported by including a 'fast path' in the error correction pipeline that handles cases in which consecutive corrections requests taken from the correction queue are directed to the same word-level location in the CWB (e.g., where a word is 64-bits in the examples herein). Without such a 'fast path' it would be problematic to consecutively correct single bits in the same 64-bit word in a 64-bit data buffer like the example CWB, because first the location is read, then the bit to be corrected is updated or 'flipped' by the correction pipeline, and then the corrected bit is written to the same location in the CWB. This process is referred to as a read-modify-write operation. However, if two or more consecutive requests from the correction queue modify bits within the same 64-bit word, but the correction pipeline does not detect and take a special action for that case, then due to the latency between reading the 64-bit word and rewriting it after correction, the earlier bit correction taken from the correction queue would be overwritten by the later correction. In other words, if data for an earlier correction is still 'in-flight' in the correction pipeline and has not been written to the CWB before a subsequent correction tries to read and modify the same data in the CWB, then the earlier corrections would be lost.

The 'fast path' aspect of the bit correction circuit includes detectors in each stage of the correction pipeline to identify and account for this scenario. When a fast path case is detected, the subsequent error correction request is switched via a multiplexor to operate on data that has already been corrected by the preceding correction, but is still being processed within the correction pipeline of the bit correction circuit and not yet written back to the CWB. Thus, the bit correction circuit is designed to prevent this potential error caused by read-modify-write problems and guarantees that corrections from the correction queue can be processed at a rate of one every clock cycle when used with a two-port memory (one read-port, one write-port) for the CWB.

FIG. 8 provides one example implementation of the bit correction circuit 800. This bit correction circuit encompasses the 'bit flip' component leading into the CWB 319 in FIG. 3. Not illustrated is the correction queue, which, as mentioned above, is a FIFO buffer from which the bit-level error locations are input into the bit correction circuit 800 at a maximum rate of one correction per clock. Bit correction circuit 800 receives the incoming bit-level error locations each clock cycle and a copy is sent to the error location decode 801, the CWB 319, fast path address comparator 803, and a pipeline register 805D on a first clock cycle. As mentioned before, the error location information is divided into error location information and address information. The address identifies the location of a 64-bit word in the CWB where the error occurs and a more specific 'error locator' that identifies the bit in the specified 64-bit word to be corrected. The error locator is sent to the error location decode 801 to determine the specific position of the bit to be corrected. The error location decode 801 places a value in the register 805A to indicate the location of the bit to be corrected, e.g., in the form of a 64-bit mask or similar value.

On a first clock cycle, the address of the 64-bit data word is sent to CWB 319 to read out the associated 64-bit word for processing. The address of the 64-bit data word is also sent to the fast-path address compare 803 to be compared with the addresses of previously modified 64-bit data words from registers 805D and 813 to see if there is a match. An adjustment to use previously-modified 64-bit data words from registers 811 or 821 in the next clock cycle is made if a match is found and a value to switch the multiplexor accordingly in the next clock cycle is placed in the buffer 805C. The 64-bit data word as read out from the CWB 319 is placed in the buffer 805B for use when no match with previous addresses is found.

On a second clock cycle the values of the registers 805A-D, 811 and 821 are utilized and the multiplexor 807 drives either the 64-bit data word from the CWB stored in register 805B if comparator 803 did not find an address match in the previous clock cycle, or a 64-bit data word retrieved and modified in the previous clock cycle stored in buffer 811 if the comparator 803 found an address match with the CWB address in register 805D in the previous clock cycle, or a 64-bit data word retrieved and modified in a clock cycle before the previous clock cycle (i.e., 2 clock cycles back) stored in register 821 if the comparator 803 found an address match with the CWB address in register 813 in the previous clock cycle. Bit correction circuit 800 uses the values in registers 811 and 821 to avoid the read-modify-write problem discussed above. The fast path address comparator 803 takes this issue into account by comparing the 64-bit word addresses accessed in the last two clock cycles as stored in registers 805D and 813. The fast path address compare then configures the multiplexor 807 to utilize the register 811 as an input where the preceding address matches the current address and to use the register 821 where the address two cycles back matches the current address. If the addresses in registers 805D and 813 both matched the current read address in the previous cycle, then the multiplexor 807 is configured to utilize register 811 as input in preference to register 821, since register 811 contains the most recently modified copy of the 64-bit data word from the matching CWB read address. If there was not a fast-path scenario detected by comparator 803 in the previous clock cycle, the value in the register 805B is utilized by multiplexor 807. In each case, the bit-flip mask value in register 805A is XOR'd with the value selected by the MUX 807 and the result is placed in the register 811. The XOR and MUX 807 can be referred to as the combination logic of the bit correction circuit 800.

On a third clock cycle, the value in register 811 is written to register 821 for possible use by the fast-path comparison of subsequent corrections and to the CWB 319 to record the accumulated changes to the data word that was identified by the location information from the CCD. Thus, in this manner over three clock cycles, information can be updated in a CWB where the correction bit rate is consistently one correction per clock cycle while the correction queue is full. The example bit correction circuit provides a mechanism that is area, cost, and power effective while providing an error correction bit rate sufficient to keep up with the CCD. The embodiments take advantage of the fact that during the actual decode by the CCD of a product code, the codeword buffer that stores the data is idle, and therefore its normal read and write ports can be utilized to apply data corrections at the maximum possible bandwidth (1 correction per clock assuming a CWB memory with one read-port and one write-port) without stalling the CCD.

Figure 9:
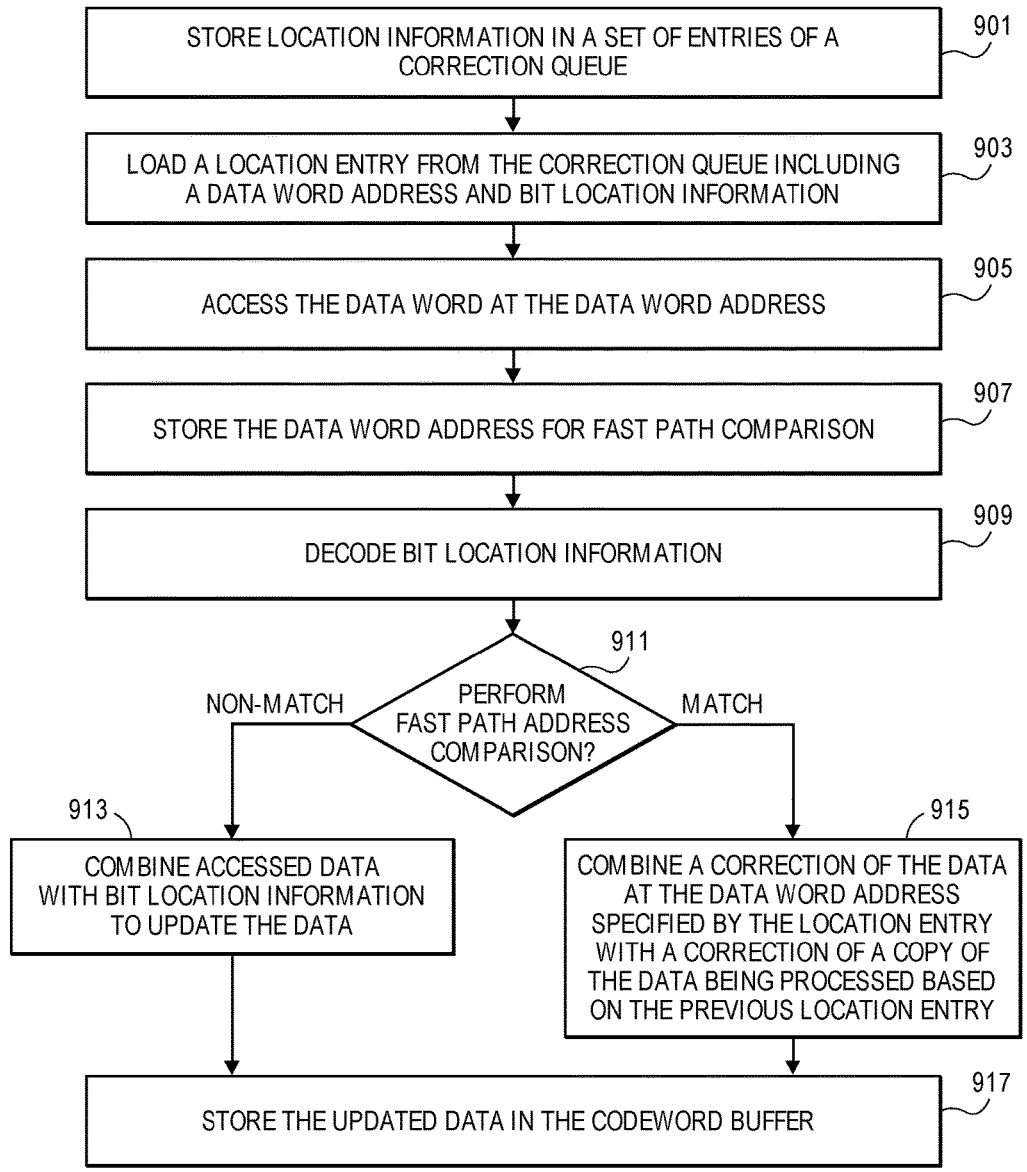
FIG. 9 is a flowchart of one embodiment of the process for bit corrections using the bit correction circuit.

FIG. 9 is a flowchart of one embodiment of the process for bit corrections using the bit correction circuit. In one embodiment, the bit correction circuit can be characterized as handling updates to bits in a data buffer such as the CWB by processing a set of location information entries stored in a correction queue (Block 901). The bit correction circuit loads a next location entry from the correction queue where the location entry includes an address of a 64-bit data word in the CWB and bit location information to identify the specific bit in the data word to be corrected (Block 903). The next entry in the correction queue can be the oldest entry as per the operation of a FIFO buffer.

The bit correction circuit processes the error location entry by accessing the data word in the CWB identified by the address information in the location entry (Block 905). This data word is loaded from the CWB into a register for possible modification. The data word in the register will be utilized if fast path processing is not applied. The data word address is also stored for fast path comparison for subsequent location entry processing to compare whether the same data word is still being processed before being written back to the CWB (Block 907). The bit location information is decoded to determine the specific bit to be modified in the data word (Block 909).

The fast path comparison determines whether a same data word is already being processed (e.g., within the last two clock cycles) by the bit correction circuit and has not yet been written back to the CWB in which case the data being processed is to be utilized for further modification rather than the stale data word in the CWB (Block 911). When the data word being modified by the loaded location entry from a different CWB address than the data word(s) already being processed, then the process modifies the currently access data word directly from the CWB (Block 913). The modified data word can then subsequently be written back to the CWB (Block 917). However, if the location entry matches the CWB address of a data word that is still being processed and has already been loaded by the bit correction circuit, then the version of the data word that is already loaded and modified is further modified (Block 915), before being written back to the CWB (Block 917).

The operations in the method diagrams presented herein were described with reference to the exemplary implementations of the other figures. However, it should be understood that the operations of the diagrams can be performed by implementations other than those discussed with reference to the other figures, and the implementations discussed with reference to these other figures can perform operations different than those discussed with reference to the diagrams. Although described and shown in a particular order, the operations of the methods presented herein are not restricted to this order. For example, one or more of the operations of the methods presented herein can be performed in a different order or in partially or fully overlapping time periods. Accordingly, the description and depiction of the methods are for illustrative purposes and are not intended to restrict to a particular implementation.

An article of manufacture can be used to store program code providing at least some of the functionality of the embodiments described above. Additionally, an article of manufacture can be used to store program code created using at least some of the functionality of the embodiments described above. An article of manufacture that stores program code can be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions. Additionally, embodiments of the invention can be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the description and claims, the terms "coupled" and "connected," along with their derivatives, can be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

In the foregoing specification, the invention has been described with reference to specific exemplary embodiments thereof. Various embodiments and aspects of the invention(s) are described with reference to details discussed in this document, and the accompanying drawings illustrate the various embodiments. The description above and drawings are illustrative of the invention and are not to be construed as limiting the invention. References in the specification to "one embodiment," "an embodiment," "an exemplary embodiment," etc., indicate that the embodiment described can include a particular feature, structure, or characteristic, but not every embodiment may necessarily include the particular feature, structure, or characteristic. Moreover, such phrases are not necessarily referring to the same embodiment. Furthermore, when a particular feature, structure, or characteristic is described in connection with an embodiment, such feature, structure, or characteristic can be implemented in connection with other embodiments whether or not explicitly described. Additionally, as used in this document, the term "exemplary" refers to embodiments that serve as simply an example or illustration. The use of exemplary should not be construed as an indication of preferred examples. Blocks with dashed borders (e.g., large dashes, small dashes, dot-dash, dots) are used to illustrate optional operations that add additional features to embodiments of the invention. However, such notation should not be taken to mean that these are the only options or optional operations, and/or that blocks with solid borders are not optional in some embodiments of the invention. Numerous specific details are described to provide a thorough understanding of various embodiments of the present invention. However, in certain instances, well-known or conventional details are not described in order to provide a concise discussion of embodiments of the present inventions.

It will be evident that various modifications can be made thereto without departing from the broader spirit and scope of the invention as set forth in the following claims. For example, the methods described in this document can be performed with fewer or more features/blocks or the features/blocks can be performed in differing orders. Additionally, the method(s) described in this document can be repeated or performed in parallel with one another or in parallel with different instances of the same or similar methods. While examples refer to memory and non-volatile storage media, embodiments can also be implemented with other types of storage media.

What is claimed is:

1. A method for implementing error correcting code (ECC) using a product code decoder, the method comprising:
   receiving a product code, wherein the product code is a matrix of row and column component codes;
   generating a plurality of row syndromes and a plurality of column syndromes from the received product code;
   storing the plurality of row syndromes in a row syndrome queue, the row syndrome queue to support a plurality of modes of operation corresponding to a plurality of phases of decoding the product code;
   storing the plurality of column syndromes in a column syndrome queue, the column syndrome queue to support the plurality of modes of operation corresponding to the plurality of phases of decoding the product code;
   correcting the plurality of row syndromes in the row syndrome queue based on errors detected in respective row syndromes and errors detecting in overlapping column syndromes;
   correcting the plurality of column syndromes in the column syndrome queue based on errors detected in respective column syndromes and errors detected in overlapping row syndromes; and
   correcting the product code in a codeword buffer at locations corresponding to corrections in the plurality of row syndromes and the plurality of column syndromes.

2. The method of claim 1, wherein the row syndrome queue stores the plurality of row syndromes by storing each received row syndrome in a register of a plurality of registers in the row syndrome queue and shifting stored row syndromes in the plurality of registers to prepare to receive a next row syndrome.

3. The method of claim 1, further comprising:
   decoding each column syndrome in the plurality of column syndromes to generate corrected column syndromes and row adjustments for row syndromes from the plurality of row syndromes in the row syndrome queue.

4. The method of claim 3, further comprising:
   combining a plurality of the row adjustments with the plurality of row syndromes in the row syndrome queue by combination logic of the row syndrome queue on a single clock cycle.

5. The method of claim 1, further comprising:
   decoding each row syndrome in the plurality of row syndromes to generate corrected row syndromes and adjustments for column syndromes from the plurality of column syndromes.

6. The method of claim 1, further comprising:
   clearing a row syndrome from the plurality of row syndromes in the row syndrome queue in response to a correction of the row syndrome.

7. The method of claim 1, further comprising:
   processing the plurality of row syndromes and the plurality column syndromes iteratively to correct errors in the product code with each row syndrome or column syndrome correction being corrected in a location in a row and column of the product code, the iterative processing rotating the plurality of row syndromes in the row syndrome queue and the plurality of column syndromes in the column syndrome queue into a component decoder and continuing until all rows and columns of the product code are corrected.

8. A product code decoder comprising:
a codeword buffer to store a received product code that is a matrix of row and column component codes;
a row syndrome generator to generate a plurality of row syndromes from the received product code;
a column syndrome generator to generate a plurality of column syndromes from the received product code;
a row syndrome queue having a plurality of registers to store the plurality of row syndromes, the row syndrome queue to support a plurality of modes of operation corresponding to a plurality of phases of decoding the product code;
a column syndrome queue having a plurality of register to store the plurality of column syndromes, the column syndrome queue to support the plurality of modes of operation corresponding to the plurality of phases of decoding the product code; and
a component code decoder coupled to the codeword buffer, row syndrome generator, and column syndrome generator, the component code decoder to correct the plurality of row syndromes in the row syndrome queue based on errors detected in respective row syndromes and errors detecting in overlapping column syndromes, to correct the plurality of column syndromes in the column syndrome queue based on errors detected in respective column syndromes and errors detected in overlapping row syndromes, and
to identify locations in the product code in the codeword buffer corresponding to corrections in the plurality of row syndromes and the plurality of column syndromes.

9. The product code decoder of claim 8, wherein the row syndrome queue stores the plurality of row syndromes by storing each received row syndrome in a register of the plurality of registers and shifting stored row syndromes in the plurality of registers to prepare to receive a next row syndrome.

10. The product code decoder of claim 8, wherein the component code decoder is to decode each column syndrome in the plurality of column syndromes to generate corrected column syndromes and row adjustments for row syndromes from the plurality of row syndromes in the row syndrome queue.

11. The product code decoder of claim 10, wherein the row syndrome queue is coupled to the component code decoder to combine a plurality of the row adjustments with the plurality of row syndromes in the row syndrome queue by combination logic of the row syndrome queue on a single clock cycle.

12. The product code decoder of claim 8, wherein the component code decoder is to decode each row syndrome in the plurality of row syndromes to generate corrected row syndromes and adjustments for column syndromes from the plurality of column syndromes.

13. The product code decoder of claim 8, wherein the component code decoder is to clear a row syndrome from the plurality of row syndromes in a row syndrome queue in response to a correction of the row syndrome.

14. The product code decoder of claim 8, wherein the component code decoder is to process the plurality of row syndromes and the plurality column syndromes iteratively to correct errors in the product code with each row syndrome or column syndrome correction being corrected in a location in a row and column of the product code, the iterative processing rotating the plurality of row syndromes in the row syndrome queue and the plurality of column syndromes in the column syndrome queue into a component decoder and continuing until all rows and columns of the product code are corrected.

15. A memory system comprising:
a set of memory elements to store data;
a host interface to receive a request to store or access data in the set of memory elements; and
a memory controller including error code correction utilizing a product code decoder, the product code decoder including,
a codeword buffer to store a received product code that is a matrix of row and column component codes,
a row syndrome generator to generate a plurality of row syndromes from the received product code,
a column syndrome generator to generate a plurality of column syndromes from the received product code,
a row syndrome queue having a plurality of registers to store the plurality of row syndromes, the row syndrome queue to support a plurality of modes of operation corresponding to a plurality of phases of decoding the product code,
a column syndrome queue having a plurality of register to store the plurality of column syndromes, the column syndrome queue to support the plurality of modes of operation corresponding to the plurality of phases of decoding the product code, and
a component code decoder coupled to the codeword buffer, row syndrome generator, and column syndrome generator, the component code decoder to correct the plurality of row syndromes in the row syndrome queue based on errors detected in respective row syndromes and errors detecting in overlapping column syndromes, to correct the plurality of column syndromes in the column syndrome queue based on errors detected in respective column syndromes and errors detected in overlapping row syndromes, and to identify locations in the product code corresponding to corrections in the plurality of row syndromes and the plurality of column syndromes.

16. The memory system of claim 15, wherein the row syndrome queue stores the plurality of row syndromes by storing each received row syndrome in a register in the plurality of registers and shifting stored row syndromes in the plurality of registers to prepare to receive a next row syndrome.

17. The memory system of claim 15, wherein the component code decoder is to decode each column syndrome in the plurality of column syndromes to generate corrected column syndromes and row adjustments for row syndromes from the plurality of row syndromes in the row syndrome queue.

18. The memory system of claim 17, wherein the row syndrome queue is coupled to the component code decoder to combine a plurality of the row adjustments with the plurality of row syndromes in the row syndrome queue by combination logic of the row syndrome queue on a single clock cycle.

19. The memory system of claim 15, wherein the component code decoder is to decode each row syndrome in the plurality of row syndromes to generate corrected row syndromes and adjustments for column syndromes from the plurality of column syndromes.

20. The memory system of claim 15, wherein the component code decoder is to process the plurality of row syndromes and the plurality column syndromes iteratively to correct errors in the product code with each row syndrome or column syndrome correction being corrected in a location in a row and column of the product code, the iterative rotating the plurality of row syndromes in the row syndrome queue and the plurality of column syndromes in the column syndrome queue into a component decoder and processing continuing until all rows and columns of the product code are corrected.

* * * * *